US012601806B2

(12) United States Patent
Xiao et al.

(10) Patent No.: US 12,601,806 B2
(45) Date of Patent: Apr. 14, 2026

(54) IMAGING DEVICE OF ELIMINATING ELECTROMAGNETIC INTERFERENCE OF MAGNETIC RESONANCE AND IMAGING METHOD THEREOF

(71) Applicant: HANGZHOU WEIYING MEDICAL TECHNOLOGY CO., LTD., Hangzhou (CN)

(72) Inventors: Linfang Xiao, Hangzhou (CN); Ruixing Zhu, Hangzhou (CN); Yilong Liu, Hangzhou (CN)

(73) Assignee: HANGZHOU WEIYING MEDICAL TECHNOLOGY CO., LTD., Hangzhou (CN)

( * ) Notice: Subject to any disclaimer, the term of this patent is extended or adjusted under 35 U.S.C. 154(b) by 0 days.

(21) Appl. No.: 18/655,366

(22) Filed: May 6, 2024

(65) Prior Publication Data

US 2024/0369664 A1     Nov. 7, 2024

(30) Foreign Application Priority Data

May 6, 2023    (CN) .......................... 202310504030.5

(51) Int. Cl.
| | |
|---|---|
| *G01R 33/58* | (2006.01) |
| *G01R 33/565* | (2006.01) |
| *G06T 11/00* | (2006.01) |

(52) U.S. Cl.
CPC ... *G01R 33/56572* (2013.01); *G01R 33/5659* (2013.01); *G01R 33/583* (2013.01);
(Continued)

(58) Field of Classification Search
CPC .......... G01R 33/56572; G01R 33/5659; G01R 33/583; G01R 33/565; A61B 5/055; G06N 3/0464; G06T 2211/441
See application file for complete search history.

(56) References Cited

PUBLICATIONS

"A low-cost and shielding-free ultra-low-field brain MRI scanner" by Y. Liu et al. Nature Comm. 12:7238, 2021.*
(Continued)

*Primary Examiner* — Jason M Ip

(57) ABSTRACT

An imaging device and method of eliminating electromagnetic interference of magnetic resonance are provided. The imaging device includes: means for acquiring magnetic resonance imaging signals, acquiring a first electromagnetic interference signal in an electromagnetic interference affected environment, and acquiring second electromagnetic interference signals in the electromagnetic interference affected environment; means for superposing the magnetic resonance imaging signals with the first electromagnetic interference signal to obtain interfered imaging signals, respectively, taking the interfered imaging signals and corresponding second electromagnetic interference signals as input, taking corresponding magnetic resonance imaging signals as output, and training and obtaining an electromagnetic interference eliminating model; means for inputting a real-time magnetic resonance imaging signal and a real-time electromagnetic interference signal into the electromagnetic interference eliminating model, to obtain a predicted magnetic resonance imaging signal that eliminates electromagnetic interference; means for performing image reconstruction on the predicted magnetic resonance imaging signal to obtain a magnetic resonance image.

7 Claims, 13 Drawing Sheets

(52) U.S. Cl.
CPC ........ *G06T 11/005* (2013.01); *G06T 2210/41* (2013.01); *G06T 2211/441* (2023.08)

(56) References Cited

PUBLICATIONS

"A CNN Based Software Gradiometer for electromagnetic Background Noise Reduction in Low Field MRI Applications" by J. Su et al. IEEE Trans Med Imag. vol. 41, No. 5, pp. 1007-1015 , Jan. 28, 2022.*

"CNN-DMRI: A Convolutional Neural Network for Denoising of Magnetic Resonance Images" by P. C. Tripathi et al. Patt Rec Let. 135, pp. 57-63, 2020.*

* cited by examiner

| Receiving coil 1 | Data acquiring module 3 | Model training module 4 |
|---|---|---|

Receiving coil 1 ──── Data acquiring module 3

Data acquiring module 3:
- First acquiring unit 31
- Second acquiring unit 32
- Third acquiring unit 33
- Fourth acquiring unit 33
- First interference signal acquiring unit 35
- Second interference signal acquiring unit 36

Receiving coil 2

Model training module 4:
- First model training unit 41
- Second model training unit 42

Interference eliminating module 5

Image reconstruction module 6

FIG. 1

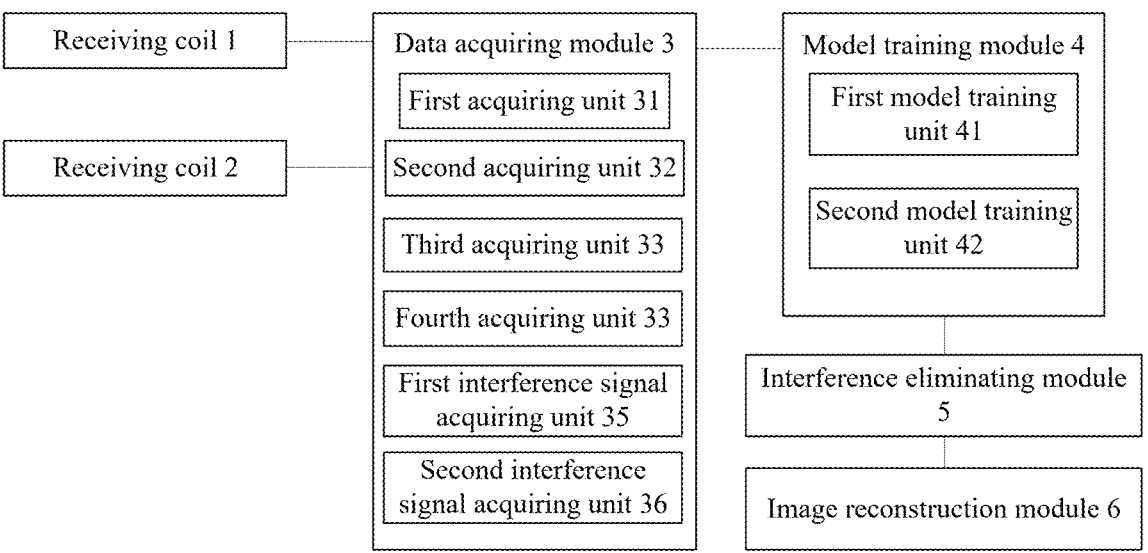

EMI sensing coil 2

Point source EMI    Plane-wave EMI

MRI 1 receiving coil

RF electronics

EMI sensing coils 2

EMI 2 sensing coils

Gradient electronics

FIG. 2

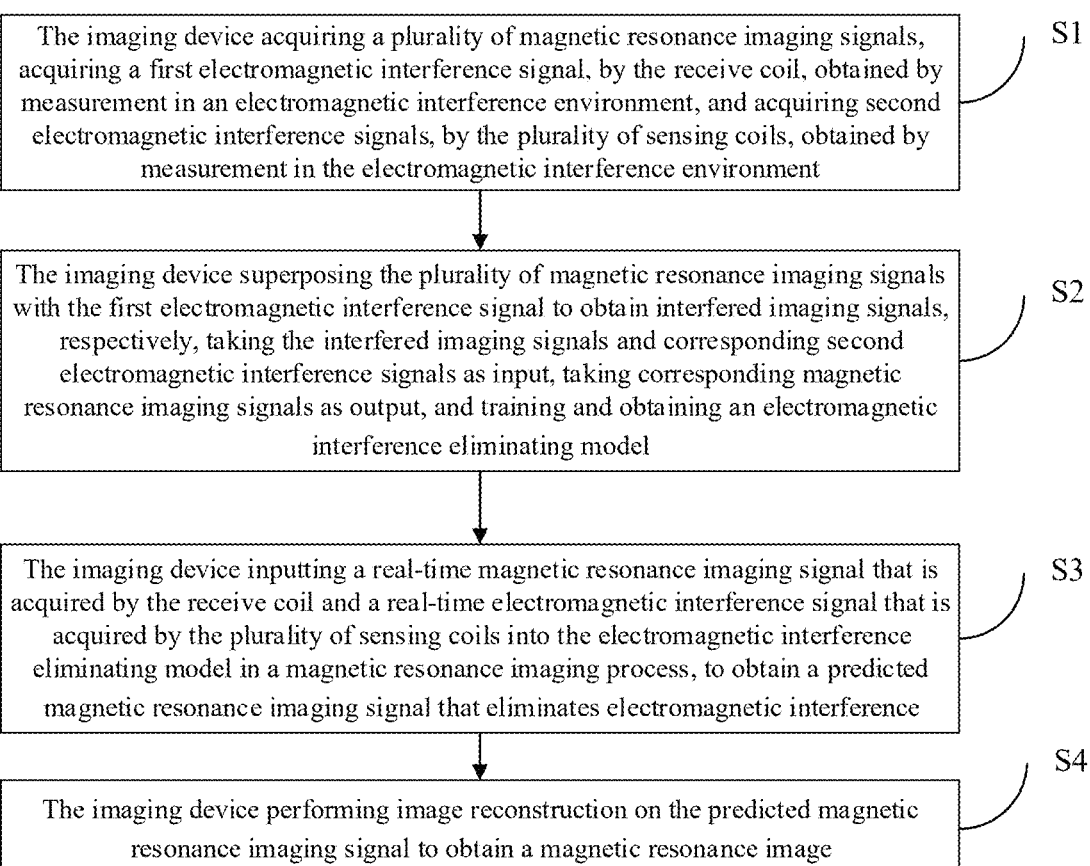

The imaging device acquiring a plurality of magnetic resonance imaging signals, acquiring a first electromagnetic interference signal, by the receive coil, obtained by measurement in an electromagnetic interference environment, and acquiring second electromagnetic interference signals, by the plurality of sensing coils, obtained by measurement in the electromagnetic interference environment      S1

The imaging device superposing the plurality of magnetic resonance imaging signals with the first electromagnetic interference signal to obtain interfered imaging signals, respectively, taking the interfered imaging signals and corresponding second electromagnetic interference signals as input, taking corresponding magnetic resonance imaging signals as output, and training and obtaining an electromagnetic interference eliminating model      S2

The imaging device inputting a real-time magnetic resonance imaging signal that is acquired by the receive coil and a real-time electromagnetic interference signal that is acquired by the plurality of sensing coils into the electromagnetic interference eliminating model in a magnetic resonance imaging process, to obtain a predicted magnetic resonance imaging signal that eliminates electromagnetic interference      S3

The imaging device performing image reconstruction on the predicted magnetic resonance imaging signal to obtain a magnetic resonance image      S4

FIG. 11

IMAGING DEVICE OF ELIMINATING ELECTROMAGNETIC INTERFERENCE OF MAGNETIC RESONANCE AND IMAGING METHOD THEREOF

CROSS-REFERENCE TO RELATED APPLICATIONS

This application claims priority to Chinese patent applications No. 202310504030.5, filed on May 6, 2023, titled "IMAGING DEVICE OF ELIMINATING ELECTROMAGNETIC INTERFERENCE OF MAGNETIC RESONANCE AND IMAGING METHOD THEREOF", the content of which is hereby incorporated by reference in its entirety.

TECHNICAL FIELD

The present disclosure generally relates to the field of carrier communication, and in particular, to an imaging device of eliminating electromagnetic interference of magnetic resonance and an imaging method thereof.

BACKGROUND

In recent years, ultra-low-field magnetic resonance imaging (ULF MRI) (<0.1 T) technology has gained significant attention both domestically and internationally. This technology is valued for its characteristics such as excellent openness, ultra-quiet operation, no requirement for electromagnetic shielding, lightweight portability, and the ability to be positioned bedside for patient convenience. ULF MRI has successfully implemented various fundamental brain imaging protocols including T1-weighted imaging, T2-weighted imaging, fluid attenuation inversion recovery, and diffusion-weighted imaging. These protocols offer valuable clinical information for diagnosing stroke and tumors, contributing to the advancement and accessibility of magnetic resonance imaging technology. During the imaging process, it is crucial to simultaneously measure electromagnetic interference from an environment or a system by a sensing coil in an imaging process and to eliminate the electromagnetic interference by advanced signal processing algorithms. This is essential for consistently obtaining high-quality images without the need for electromagnetic shielding.

However, when a coupling among a subject, environment, and multiple receiving coils in terms of electromagnetic interference undergoes significant changes, a conventional method may struggle to effectively eliminate electromagnetic interference to an imaging coil. Firstly, the conventional method assumes that the coupling among the subject, the environment, and multiple receiving coils in terms of electromagnetic interference remains relatively constant over a period. However, in practical imaging situations, the coupling among the subject, the environment, and multiple receiving coils in terms of electromagnetic interference is bound to change due to factors such as patient movement, shifts in the position of interfering sources, or alterations in the state of the interfering sources. Secondly, methods for electromagnetic interference elimination that rely on calibration data may encounter challenges when there is inconsistency between a coupling relationship indicated by calibration data and an actual coupling relationship observed in imaging data. This discrepancy can impact the effectiveness of interference elimination. Thirdly, the finite nature of calibration data can also impact the accuracy of the model obtained, whether the method is based on a coupling function or employs deep learning techniques.

SUMMARY

According to various embodiments of the present disclosure, an imaging device of eliminating electromagnetic interference of magnetic resonance and an imaging method thereof are provided.

In a first aspect, an imaging device of eliminating electromagnetic interference of magnetic resonance is provided. A receiving coil and a plurality of sensing coils are preconfigured in the imaging device. The imaging device includes:

means for acquiring a plurality of magnetic resonance imaging signals, acquiring a first electromagnetic interference signal, by the receiving coil, obtained by measurement in an electromagnetic interference affected environment, and acquiring second electromagnetic interference signals, by the plurality of sensing coils, obtained by measurement in the electromagnetic interference affected environment;

means for superposing the plurality of magnetic resonance imaging signals with the first electromagnetic interference signal to obtain interfered imaging signals, respectively, taking the interfered imaging signals and corresponding second electromagnetic interference signals as input, taking corresponding magnetic resonance imaging signals as output, and training and obtaining an electromagnetic interference eliminating model;

means for inputting a real-time magnetic resonance imaging signal that is acquired by the receiving coil and a real-time electromagnetic interference signal that is acquired by the plurality of sensing coils into the electromagnetic interference eliminating model in a magnetic resonance imaging process, to obtain a predicted magnetic resonance imaging signal that eliminates electromagnetic interference; and means for performing image reconstruction on the predicted magnetic resonance imaging signal to obtain a magnetic resonance image.

In an embodiment, the first electromagnetic interference signal is obtained, by the receiving coil, by measurement in a period of a calibration window, or a period of waiting for a longitudinal magnetization vector to be restored to an original state; and the second electromagnetic interference signals are obtained, by the plurality of sensing coils, by measurement in the period of the calibration window, or the period of waiting for the longitudinal magnetization vector to be restored to the original state.

In an embodiment, a model structure of the electromagnetic interference eliminating model includes a first convolution layer, a first residual network layer, a first strided convolution layer, a second residual network layer, a second strided convolutional layer, a third residual network layer, a third strided convolution layer, a fourth residual network layer, a first deconvolution layer, a fifth residual network layer, a second deconvolution layer, a sixth residual network layer, a third deconvolution layer, a seventh residual network layer, and a second convolution layer, an input of the first convolution layer is used as an input of the electromagnetic interference eliminating model;

an input of the first residual network layer is connected to an output of the first convolution layer;

an input of the first strided convolution layer is connected to an output of the first residual network layer;

an input of the second residual network layer is connected to an output of the first strided convolution layer;

an input of the second strided convolution layer is connected to an output of the second residual network layer;

an input of the third residual network layer is connected to an output of the second strided convolution layer;

an input of the third strided convolution layer is connected to an output of the third residual network layer;

an input of the fourth residual network layer is connected to an output of the third strided convolution layer;

an input of the first deconvolution layer is connected to an output of the fourth residual network layer;

an input of the fifth residual network layer is connected to an output of the first deconvolution layer;

an input of the second deconvolution layer is connected to an output of the fifth residual network layer;

an input of the sixth residual network layer is connected to an output of the second deconvolution layer;

an input of the third deconvolution layer is connected to an output of the sixth residual network layer;

an input of the seventh residual network layer is connected to an output of the third deconvolution layer;

an input of the second convolution layer is connected to an output of the seventh residual network, and an output of the second convolution layer is used as an output of the electromagnetic interference eliminating model; and the first strided convolution layer is in skip connection with the third strided convolution layer, the second strided convolution layer is in skip connection with the second strided convolution layer, and the third strided convolution layer is in skip connection with the first strided convolution layer.

In an embodiment, acquiring the plurality of magnetic resonance imaging signals further includes one of:

acquiring, in a non-electromagnetic interference affected environment, magnetic resonance signals acquired by the receiving coil as the magnetic resonance imaging signals;

acquiring, in an electromagnetic interference affected environment, magnetic resonance signals acquired by the receiving coil as the magnetic resonance imaging signals;

emulating and generating the magnetic resonance imaging signals; and randomly generating the magnetic resonance imaging signals.

In an embodiment, the imaging device further includes a built-in radio frequency system, and acquiring the first electromagnetic interference signal further includes:

acquiring, in an environment in which electromagnetic interference is caused and the radio frequency system disables transmitting radio frequency, an electromagnetic signal measured by the receiving coil as the first electromagnetic interference signal.

In an embodiment, acquiring the first electromagnetic interference signal further includes:

converting the first electromagnetic interference signal to obtain corresponding frequency domain spatial data, and taking high frequency data of the frequency domain spatial data as a new first electromagnetic interference signal.

In an embodiment, taking the interfered imaging signals and corresponding second electromagnetic interference signals as input, taking corresponding magnetic resonance imaging signals as output, and training and obtaining an electromagnetic interference eliminating model further includes:

converting the interfered imaging signals into corresponding first frequency domain data, converting the corresponding second electromagnetic interference signals into corresponding second frequency domain data, converting the corresponding magnetic resonance imaging signals into corresponding third frequency domain data, taking the first frequency domain data and the second frequency domain data as input, taking the corresponding third frequency domain data as output, and training and obtaining the electromagnetic interference eliminating model.

In an embodiment, taking the interfered imaging signals and corresponding second electromagnetic interference signals as input, taking corresponding magnetic resonance imaging signals as output, and training and obtaining an electromagnetic interference eliminating model further includes:

truncating first segments from the interfered imaging signals, truncating corresponding second segments from the corresponding second electromagnetic interference signals, truncating corresponding third segments from the corresponding magnetic resonance imaging signals, taking the first segments and the corresponding second segments as input, taking the corresponding third segments as output, and training and obtaining the electromagnetic interference eliminating model.

In a second aspect, an imaging method of eliminating electromagnetic interference of magnetic resonance is provided, applied to the above imaging device of eliminating electromagnetic interference of magnetic resonance. The imaging method includes:

Step 1, the imaging device acquiring a plurality of magnetic resonance imaging signals, acquiring a first electromagnetic interference signal, by the receiving coil, obtained by measurement in an electromagnetic interference affected environment, and acquiring second electromagnetic interference signals, by the plurality of sensing coils, obtained by measurement in the electromagnetic interference affected environment;

Step 2, the imaging device superposing the plurality of magnetic resonance imaging signals with the first electromagnetic interference signal to obtain interfered imaging signals, respectively, taking the interfered imaging signals and corresponding second electromagnetic interference signals as input, taking corresponding magnetic resonance imaging signals as output, and training and obtaining an electromagnetic interference eliminating model;

Step 3, the imaging device inputting a real-time magnetic resonance imaging signal that is acquired by the receiving coil and a real-time electromagnetic interference signal that is acquired by the plurality of sensing coils into the electromagnetic interference eliminating model in a magnetic resonance imaging process, to obtain a predicted magnetic resonance imaging signal that eliminates electromagnetic interference; and Step 4, the imaging device performing image reconstruction on the predicted magnetic resonance imaging signal to obtain a magnetic resonance image.

In an embodiment, at Step 1, acquiring the first electromagnetic interference signal further includes:

the receiving coil obtaining the first electromagnetic interference signal by measurement in a period of a calibration window, or a period of waiting for a longitudinal magnetization vector to be restored to an original state; and acquiring the second electromagnetic interference signals further includes:

the plurality of sensing coils obtaining the second electromagnetic interference signals by measurement in the period of the calibration window, or the period of waiting for the longitudinal magnetization vector to be restored to the original state.

Details of one or more embodiments of the present disclosure are set forth in the following accompanying drawings and description. Other features, objectives, and advantages of the present disclosure become obvious with reference to the specification, the accompanying drawings, and the claims.

BRIEF DESCRIPTION OF THE DRAWINGS

In order to more clearly illustrate the technical solutions in the embodiments of the present disclosure or the related technology, the accompanying drawings to be used in the description of the embodiments or the related technology will be briefly introduced below, and it will be obvious that the accompanying drawings in the following description are only some of the embodiments of the present disclosure, and that, for one skilled in the art, other accompanying drawings can be obtained based on these accompanying drawings without putting in creative labor.

FIG. 1 is a schematic diagram of an imaging device of eliminating electromagnetic interference of magnetic resonance in an embodiment.

FIG. 2 is a schematic diagram of an imaging device of eliminating electromagnetic interference of magnetic resonance in an embodiment.

FIG. 11 is a flowchart of an imaging method of eliminating electromagnetic interference of magnetic resonance in an embodiment.

DETAILED DESCRIPTION OF THE EMBODIMENT

Figure 3:
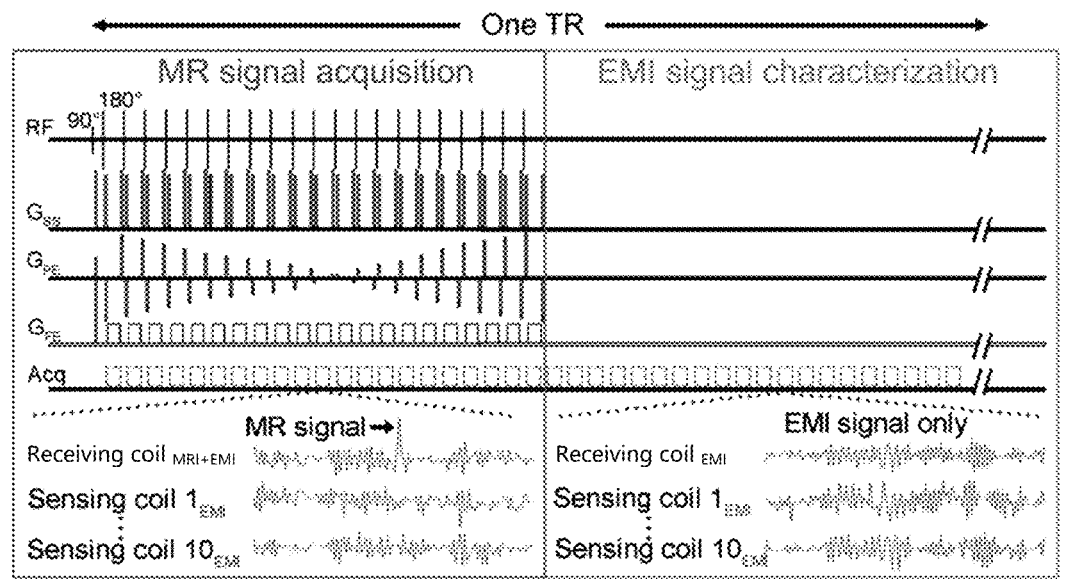
FIG. 3 is a schematic diagram of a sequence design that uses "dead time" to obtain signals in an embodiment.

The technical solutions in the embodiments of the present disclosure will be described clearly and completely in the following in conjunction with the accompanying drawings in the embodiments of the present disclosure, and it is obvious that the described embodiments are only a part of the embodiments of the present disclosure, but not all of the embodiments. Based on the embodiments in the present disclosure, all other embodiments obtained by one skilled in the art without making creative labor fall within the scope of protection of the present disclosure. In addition, it is also understood that although the efforts made in a development process may be complex and lengthy, some changes in design, manufacture, or production based on technical contents disclosed in the present disclosure are just conventional technical means for one skilled in the art related to the contents disclosed in the present disclosure, and should not be construed as inadequate disclosure of the contents disclosed in the present disclosure.

In an embodiment, an imaging device of eliminating electromagnetic interference of magnetic resonance is provided. A receiving coil 1 and a plurality of sensing coils 2 are preconfigured in the imaging device. Referring to FIG. 1, the imaging device includes a data acquiring module 3, a model training module 4, an interference eliminating module 5, and an image reconstruction module 6.

The data acquiring module 3 is configured for acquiring a plurality of magnetic resonance imaging signals, acquiring a first electromagnetic interference signal, by the receiving coil 1, obtained by measurement in an electromagnetic interference affected environment, and acquiring second electromagnetic interference signals, by the plurality of sensing coils 2, obtained by measurement in the electromagnetic interference affected environment.

The model training module 4 is connected to the data acquiring module 3, and the model training module 4 is configured for superposing the plurality of magnetic resonance imaging signals with the first electromagnetic interference signal to obtain interfered imaging signals, respectively, taking the interfered imaging signals and corresponding second electromagnetic interference signals as input, taking corresponding magnetic resonance imaging signals as output, and training and obtaining an electromagnetic interference eliminating model.

The interference eliminating module 5 is connected to the model training module 4, and the interference eliminating module 5 is configured for inputting a real-time magnetic resonance imaging signal that is acquired by the receiving coil and a real-time electromagnetic interference signal that is acquired by the plurality of sensing coils into the electromagnetic interference eliminating model in a magnetic resonance imaging process, to obtain a predicted magnetic resonance imaging signal that eliminates electromagnetic interference.

The image reconstruction module 6 is connected to the interference eliminating module 5, and the image reconstruction module 6 is configured for performing image reconstruction on the predicted magnetic resonance imaging signal to obtain a magnetic resonance image.

Specifically, in the present embodiment, referring to FIG. 2, a magnetic resonance imaging device that may be implemented without electromagnetic shielding is provided. A magnetic resonance receiving coil 1 (MRI receiving coil) is configured to receive magnetic resonance imaging signals, but due to lack of electromagnetic shielding, magnetic resonance imaging signals are received while inevitably being subjected to electromagnetic interference from different sources. The electromagnetic interference may originate from an environment, or may originate from Gradient electronics or RF electronics of a system. The electromagnetic interference may be represented as point source or plane-wave. To implement that relatively clear magnetic resonance imaging can be obtained in no electromagnetic shielding case, the plurality of sensing coils 2 (EMI Sensing coils) may be disposed inside an imaging device cabinet to acquire electromagnetic interference signals generated by the system itself, and may be disposed around a scanning bed to acquire electromagnetic interference signals generated in the environment. The acquired electromagnetic interference signals are configured for subsequent electromagnetic interference eliminating.

Electromagnetic interference sources may generate electromagnetic interference to the receiving coil 1, so that there is a significant "difference" between a real-time magnetic resonance imaging signal acquired in a magnetic resonance imaging process and a magnetic resonance imaging signal that is not subjected to electromagnetic interference. A change in interference intensity, a direction, and a position of the electromagnetic interference sources may affect relative values of an amplitude and a phase of the electromagnetic interference received by the sensing coils and the receiving coil. That is, the interference intensity, the direction, and the position of the electromagnetic interference sources have a coupling relationship with the relative values of the amplitude and the phase of the electromagnetic interference received by the sensing coils and the receiving coil. Generally, the greater signal intensity of the electromagnetic interference sources, the greater the "difference", and the closer positions of the electromagnetic interference sources and the receiving coil 1, the greater the "difference". In a magnetic resonance imaging process, a motion of a patient, change of a position of the interfering sources, or change of a state of the electromagnetic interference sources may change the coupling relationship. Therefore, real-time electromagnetic interference signals acquired by the plurality of sensing coils 2 and a real-time magnetic resonance signal acquired by the receiving coil 1 may be taken as input of the interference eliminating model, so that a dynamic change of the coupling relationship in term of electromagnetic interference can be adapted to restore a magnetic resonance imaging signal that is not interfered with electromagnetic interference, so as to obtain artifact-free images.

In an embodiment, the first electromagnetic interference signal may be obtained, by the receiving coil 1, by measurement in a period of a calibration window, or a period of waiting for a longitudinal magnetization vector to be restored to an original state; and the second electromagnetic interference signals may be obtained, by the plurality of sensing coils 2, by measurement in the period of the calibration window, or the period of waiting for the longitudinal magnetization vector to be restored to the original state.

Specifically, in the present embodiment, referring to FIG. 3, a sequence design in which "dead time" is used to obtain a calibration signal may be designed. Magnetic resonance imaging signal acquisition (MR signal acquisition) may be performed at an imaging window to obtain magnetic resonance imaging signals, and the first electromagnetic interference signal (Receiving coil MRI+EMI) and the second electromagnetic interference signals (Sensing coil 1 EMI, . . . , Sensing coil 10 EMI) may be simultaneously acquired at a calibration window.

The electromagnetic interference signal may also be measured in the period of waiting for the longitudinal magnetization vector to be restored to the original state (EMI signal characterization, i.e., "dead time") to obtain the first electromagnetic interference signal (Receiving coil EMI) and the second electromagnetic interference signal (Sensing coil 1 EMI . . . Sensing coil 10 EMI).

Figure 4:
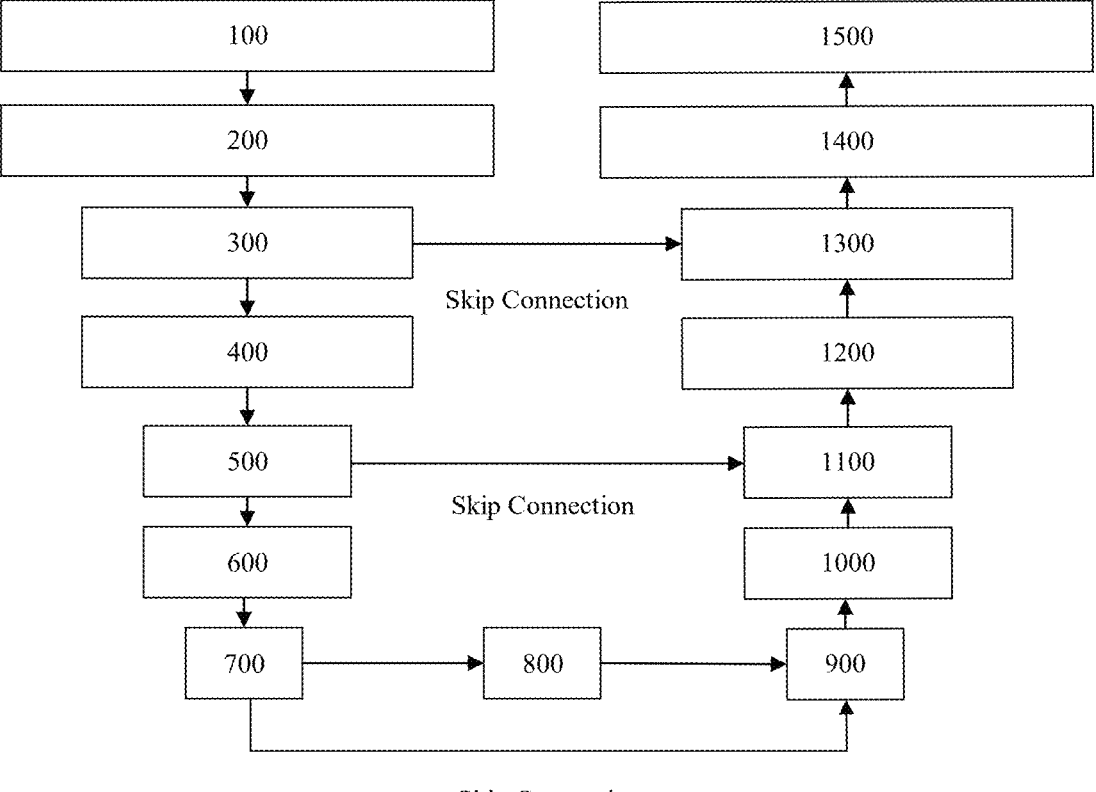
FIG. 4 is a schematic diagram of an electromagnetic interference eliminating model in an embodiment.

In an embodiment, referring to FIG. 4, a model structure of the electromagnetic interference eliminating model include a first convolution layer 100, a first residual network layer 200, a first strided convolution layer 300, a second residual network layer 400, a second strided convolutional layer 500, a third residual network layer 600, a third strided convolution layer 700, a fourth residual network layer 800, a first deconvolution layer 900, a fifth residual network layer 1000, a second deconvolution layer 1100, a sixth residual network layer 1200, a third deconvolution layer 1300, a seventh residual network layer 1400, and a second convolution layer 1500, an input of the first convolution layer 100 is used as an input of the electromagnetic interference eliminating model;

an input of the first residual network layer 200 is connected to an output of the first convolution layer 100;

an input of the first strided convolution layer 300 is connected to an output of the first residual network layer 200;

an input of the second residual network layer 400 is connected to an output of the first strided convolution layer 300;

an input of the second strided convolution layer 500 is connected to an output of the second residual network layer 400;

an input of the third residual network layer 600 is connected to an output of the second strided convolution layer 500;

an input of the third strided convolution layer 700 is connected to an output of the third residual network layer 600;

an input of the fourth residual network layer 800 is connected to an output of the third strided convolution layer 700;

an input of the first deconvolution layer 900 is connected to an output of the fourth residual network layer 800;

an input of the fifth residual network layer 1000 is connected to an output of the first deconvolution layer 900;

an input of the second deconvolution layer 1100 is connected to an output of the fifth residual network layer 1000;

an input of the sixth residual network layer 1200 is connected to an output of the second deconvolution layer 1100;

an input of the third deconvolution layer 1300 is connected to an output of the sixth residual network layer 1200;

an input of the seventh residual network layer 1400 is connected to an output of the third deconvolution layer 1300;

an input of the second convolution layer 1500 is connected to an output of the seventh residual network 1400, and an output of the second convolution layer 1500 is used as an output of the electromagnetic interference eliminating model; and the first strided convolution layer 300 is in skip connection with the third strided convolution layer 1300, the second strided convolution layer 500 is in skip connection with the second strided convolution layer 1100, and the third strided convolution layer 700 is in skip connection with the first strided convolution layer 900.

In an embodiment, the first residual network layer 200, the second residual network layer 400, and the third residual network layer 600 may all include four residual blocks.

Specifically, in the present embodiment, the electromagnetic interference eliminating model may be constructed according to a U-net combined with a residual structure (Residual U-Net). The network may include four scales connected in sequence, and quantities of channels are 12, 32, 64, and 128 in sequence. Scales may include four residual blocks. In a model training process of a typical embodiment, an Adam optimizer may be used to minimize an L1 loss function, a loss value between the input and the output of the model may be calculated according to the L1 loss function, and a model parameter may be adjusted according to the loss value, so that electromagnetic interference eliminating of the model can achieve an expected ideal effect. A batch size may be set to 64, an initial learning rate may be set to 0.0002, 40 training epochs may be performed, and the electromagnetic interference eliminating model may be obtained after completion of the training.

In an embodiment, referring to FIG. 1, the data acquiring module 3 may further include a first acquiring unit 31, a second acquiring unit 32, a third acquiring unit 33, or a fourth acquiring unit 34;

the first acquiring unit 31 is configured for acquiring, in a non-electromagnetic interference affected environment, magnetic resonance signals acquired by the receiving coil as the magnetic resonance imaging signals;

the second acquiring unit 32 is configured for acquiring, in an electromagnetic interference affected environment, magnetic resonance signals acquired by the receiving coil as the magnetic resonance imaging signals;

the third acquiring unit 33 is configured for emulating and generating the magnetic resonance imaging signals; and the fourth acquiring unit 34 is configured for randomly generating the magnetic resonance imaging signals.

Specifically, in the present embodiment, during model training, the plurality of magnetic resonance imaging signals may be acquired in advance, and the plurality of magnetic resonance imaging signals may be superposed with the first electromagnetic interference signal obtained by the receiving coil to obtain the interfered imaging signals, so as to simulate that the magnetic resonance imaging signals are affected by the electromagnetic interference of the electromagnetic interference sources in an actual imaging process.

The electromagnetic interference eliminating model is expected to eliminate the first electromagnetic interference signal from the interfered imaging signals (i.e., the magnetic resonance imaging signals and the first electromagnetic interference signal are superposed) in a case that the coupling relationship in term of electromagnetic interference dynamically changes, so as to obtain the magnetic resonance imaging signals that are not superposed with the first electromagnetic interference signal. Therefore, the magnetic resonance imaging signals may be: 1. magnetic resonance imaging signals in a non-electromagnetic interference affected environment; 2. magnetic resonance imaging signals in an electromagnetic interference affected environment; 3. emulated magnetic resonance imaging signals; 4. randomly generated magnetic resonance imaging signals. In addition to the foregoing magnetic resonance imaging signals, the magnetic resonance imaging signals may be obtained from different imaging objects, different scanning times, different scanning environments, and even different imaging systems. In this way, diversity of training data may be satisfied, and pre-training of the model may be implemented, thereby improving efficiency of performing electromagnetic interference eliminating in an actual magnetic resonance imaging process.

It is obvious that magnetic resonance imaging signals without electromagnetic interference have a best effect on model training.

In an embodiment, referring to FIG. 1, the imaging device may further include a built-in radio frequency system, and the data acquiring module 3 may further include a first interference signal acquiring unit 35. The first interference signal acquiring unit 35 is configured for acquiring, in an environment in which electromagnetic interference is caused and the radio frequency system transmits radio frequency, an electromagnetic signal measured by the receiving coil as the first electromagnetic interference signal.

Specifically, in the present embodiment, the first electromagnetic interference signal may also be obtained in a case that the electromagnetic interference is caused and the radio frequency system disables transmitting radio frequency. When the radio frequency system disables transmitting radio frequency, signals received by the receiving coil does not include the magnetic resonance imaging signals, which completely reflects electromagnetic interference of the electromagnetic interference sources to the receiving coil, and weakens the limited nature of calibration data (i.e., the first electromagnetic interference signal) in conventional methods.

Figure 5A:
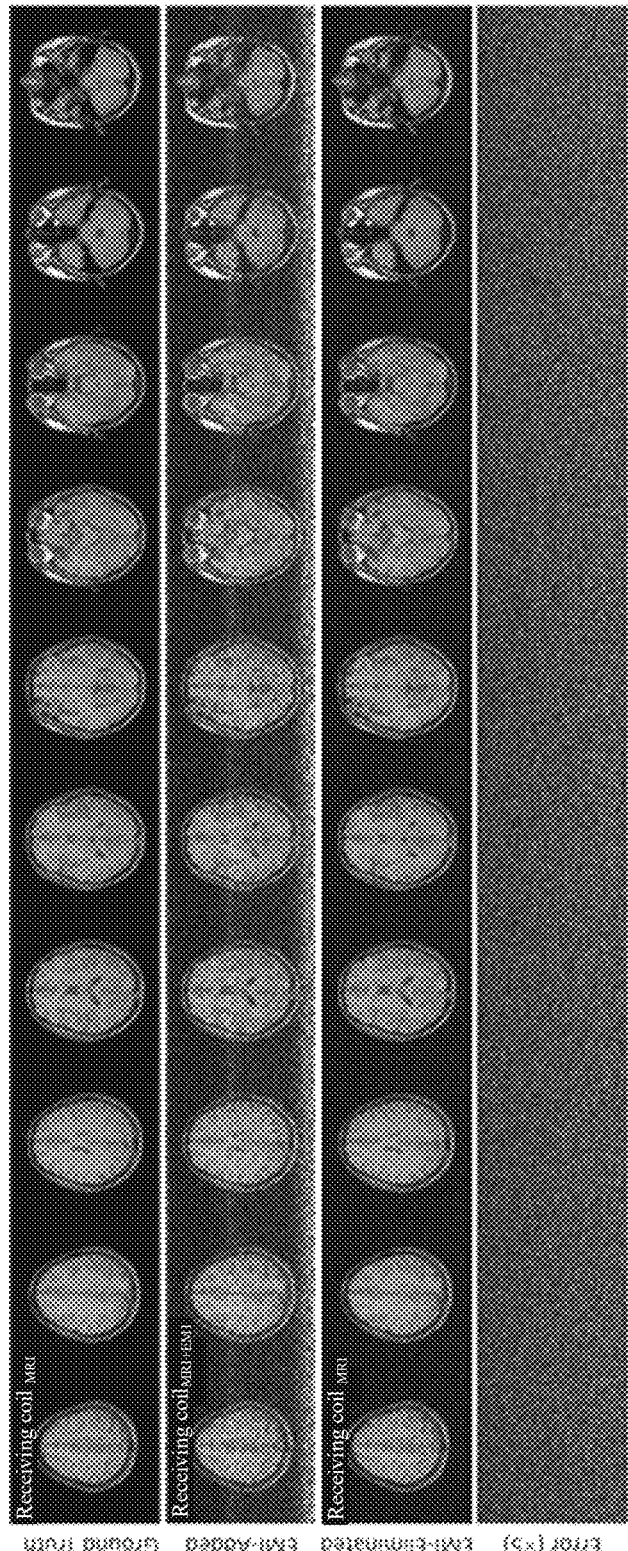
FIG. 5A to FIG. 5C are schematic diagrams of a test result of simulation data in an embodiment.
Figure 5B:
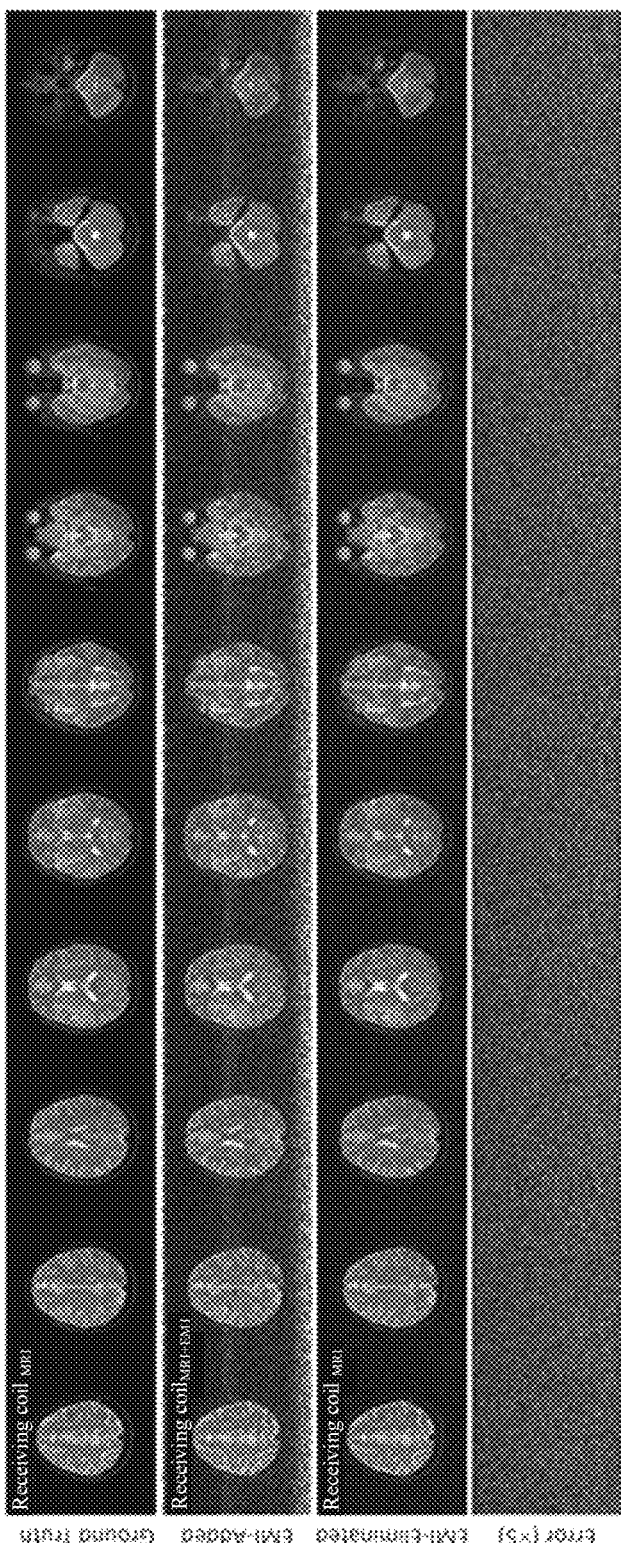
Figure 5C:
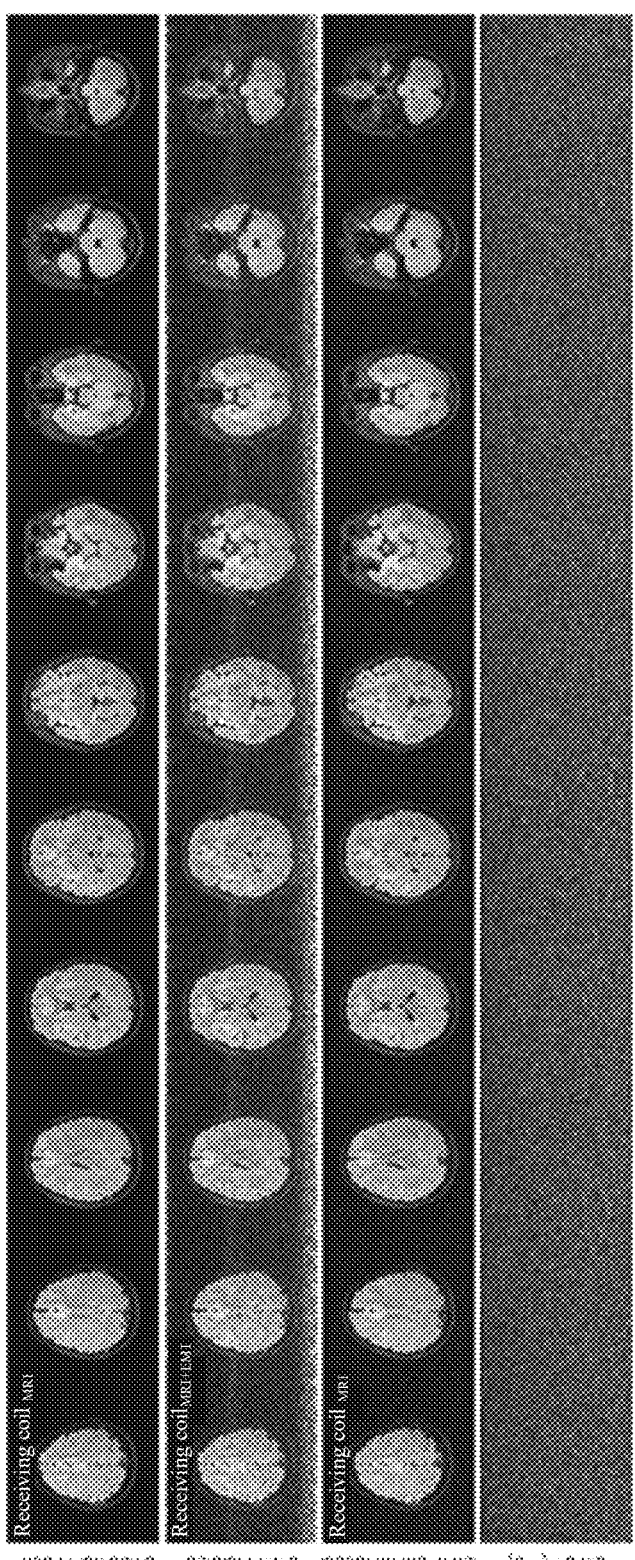

Referring to FIG. 5, FIG. 5 is a schematic diagram of a test result of simulation data. Magnetic resonance imaging (MRI) signal data obtained without electromagnetic interference (EMI) may be acquired in a fully electromagnetic shielded environment as Ground Truth. In addition, in an electromagnetic shielding-free environment, a transmit radio frequency chain may be disabled, the first electromagnetic interference signal may be measured by the receiving coil 1, the second electromagnetic interference signal may be measured by the plurality of sensing coils 3, and the first electromagnetic interference signal and the magnetic resonance imaging signals that are measured by the receiving coil 1 may be superposed as imaging signal data (EMI-Added) affected by the electromagnetic interference. Finally, imaging signal data (EMI-Eliminated) without electromagnetic interference may be obtained by using image signal data affected by electromagnetic interference and the second electromagnetic interference signals measured by the plurality of sensing coils 2 as an input, and a difference between the image signal data without electromagnetic interference and the Ground Truth may be calculated, which is defined as an error.

Corresponding Images may be obtained by an image reconstruction method based on all the foregoing data. Sub-images denoted as A, B, and C in FIG. 5 (i.e., FIG. 5A, FIG. 5B, and FIG. 5C) may be T1 weighted, T2 weighted, and FLAIR images, respectively. The corresponding error may be magnified by 5 times.

In an embodiment, referring to FIG. 1, the data acquiring module 3 may further include a second interference signal acquiring unit 36. The second interference signal acquiring unit 36 is configured for converting the first electromagnetic interference signal to obtain corresponding frequency domain spatial data, and taking high frequency data of the frequency domain spatial data as a new first electromagnetic interference signal.

Specifically, in the present embodiment, the first electromagnetic interference signal may refer to a high frequency part in frequency domain space (i.e., k-space) of magnetic resonance imaging data after Fourier transform. For the high frequency part in the frequency domain space, the magnetic resonance imaging signals typically exhibit extremely low amplitude, potentially being overshadowed by electromagnetic interference. Therefore, the magnetic resonance imaging signals may be considered as the first electromagnetic interference signal. This approach can effectively improve the accuracy of the model, particularly in cases where there is inconsistency in the coupling relationship in term of electromagnetic interface between "imaging window" and "dead time".

In an embodiment, referring to FIG. 1, the model training module 4 may further include a first model training unit 41. The first model training unit 41 is configured for converting the interfered imaging signals into corresponding first frequency domain data, converting the corresponding second electromagnetic interference signals into corresponding second frequency domain data, converting the corresponding magnetic resonance imaging signals into corresponding third frequency domain data, taking the first frequency domain data and the second frequency domain data as input, taking the corresponding third frequency domain data as output, and training and obtaining the electromagnetic interference eliminating model.

Figure 6A:
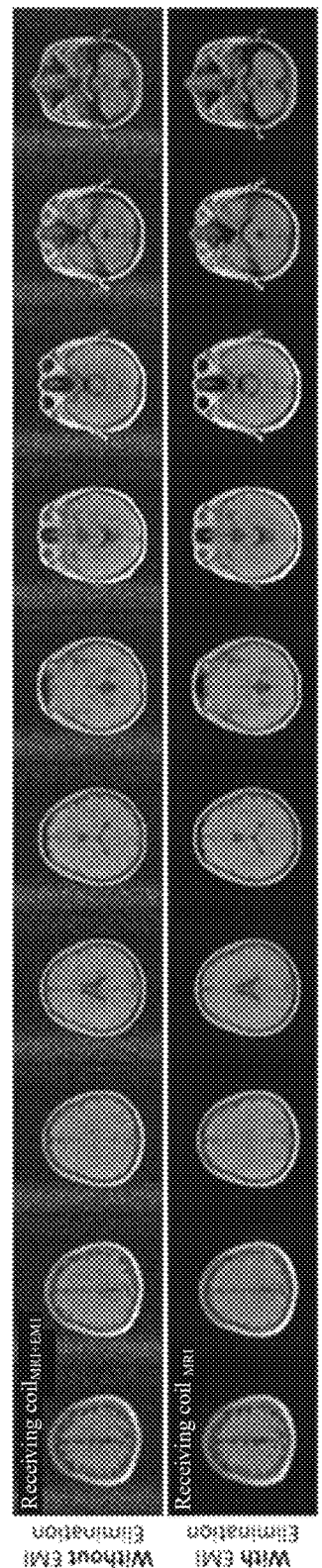
FIG. 6A to FIG. 6C are schematic diagrams of a test result of actual acquired data in an embodiment.
Figure 6B:
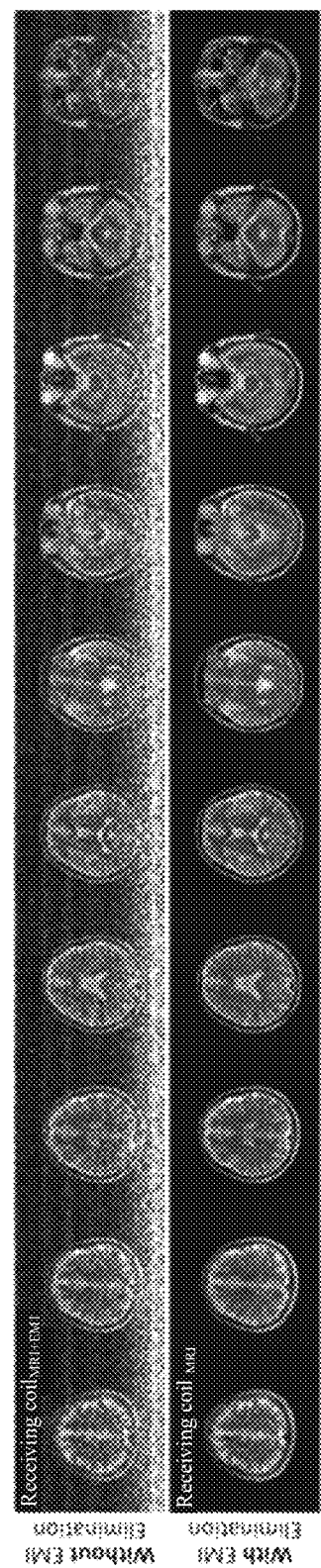
Figure 6C:
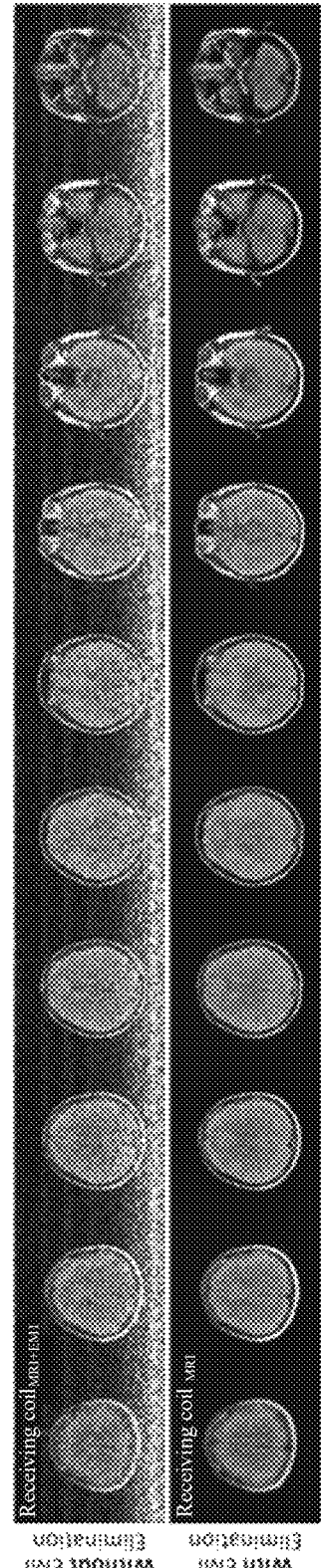
Figure 7:
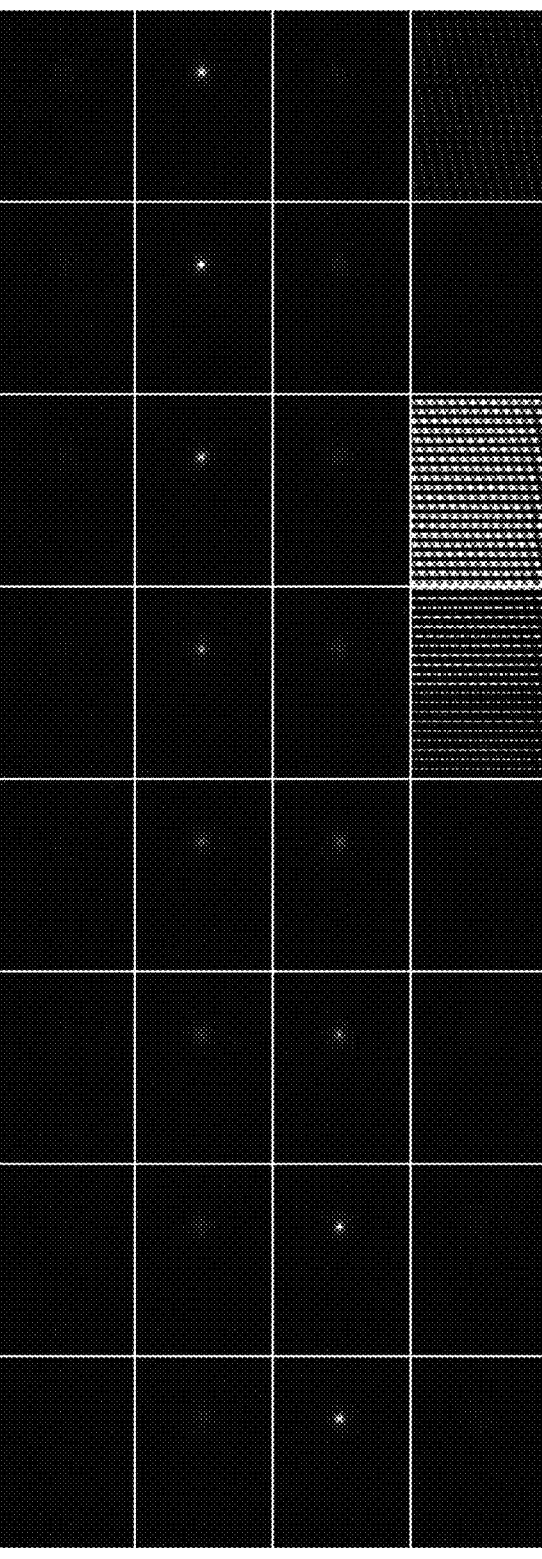
FIG. 7 is a schematic diagram of frequency domain data without electromagnetic interference elimination in an embodiment.
Figure 8:
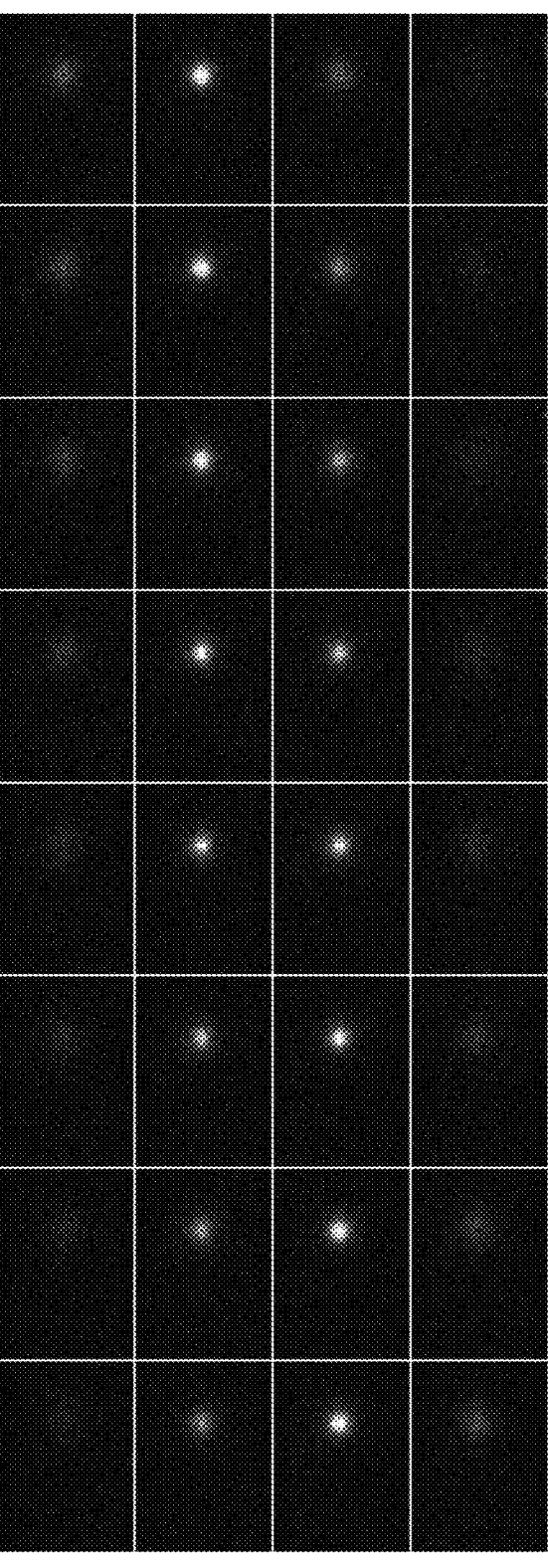
FIG. 8 is a schematic diagram of frequency domain data with electromagnetic interference elimination in an embodiment.
Figure 9:
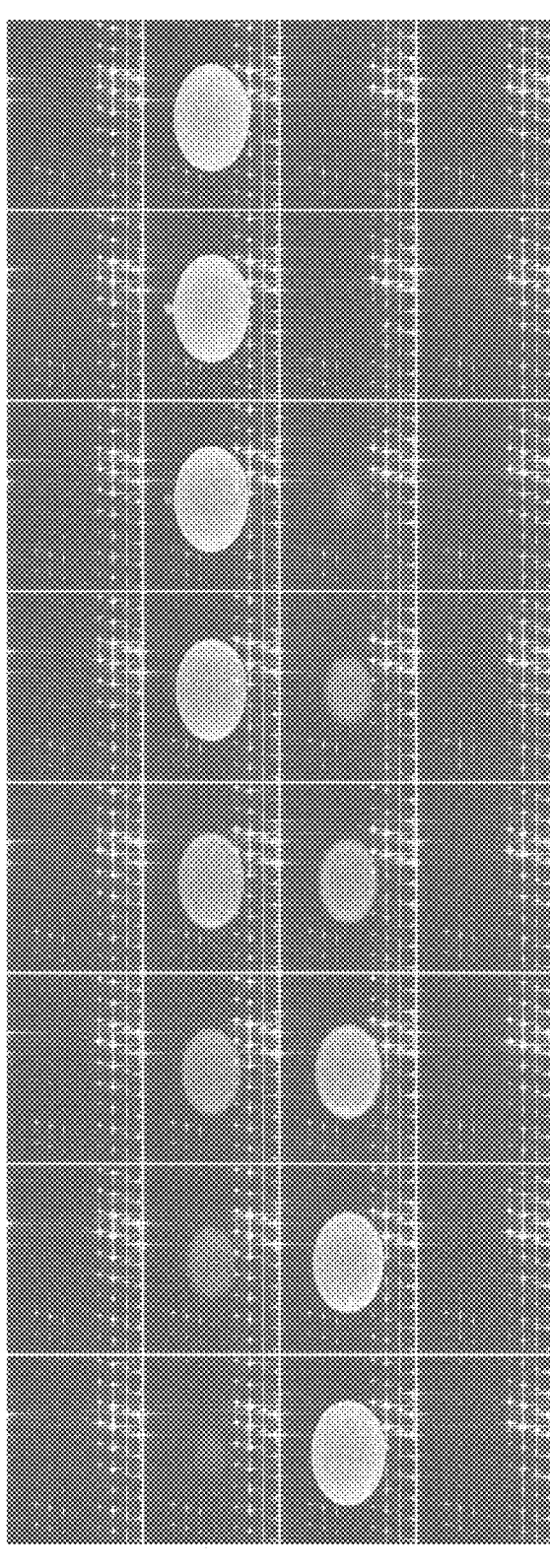
FIG. 9 is a schematic diagram of a reconstructed image without electromagnetic interference elimination in an embodiment.
Figure 10:
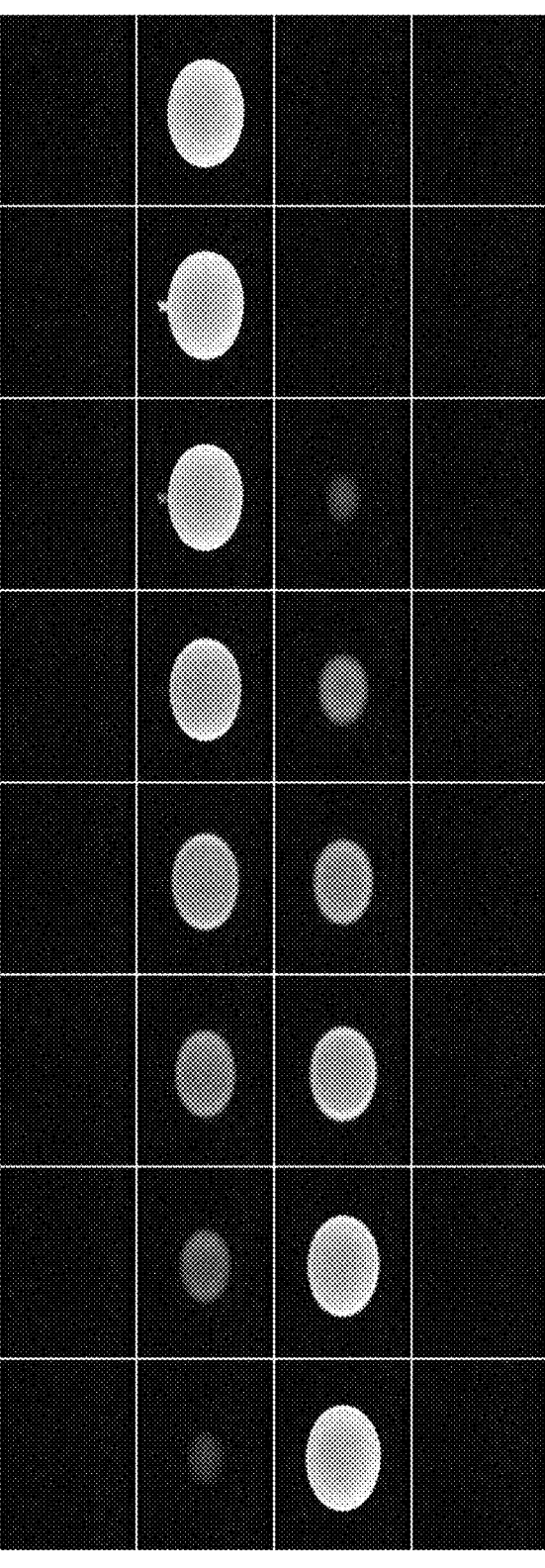
FIG. 10 is a schematic diagram of a reconstructed image with electromagnetic interference elimination in an embodiment.

Referring to FIG. 6 to FIG. 10, FIG. 6 is a schematic diagram of a test result of actual acquired data (human body scanning) in an embodiment, including FIG. 6A, FIG. 6B, and FIG. 6C. FIG. 7 is a schematic diagram of frequency domain data (i.e., k-space data) without electromagnetic interference elimination, FIG. 8 is a schematic diagram of frequency domain data with electromagnetic interference elimination, FIG. 9 is a schematic diagram of a reconstructed image without electromagnetic interference elimination, and FIG. 10 is a schematic diagram of a reconstructed image with electromagnetic interference elimination. An implementation effect of the present disclosure on actually acquired data may be shown by comparing with the reconstructed images with and without electromagnetic interference elimination. In a model training phase, required training data may be synthesized with calibration data acquired within the "dead time" and magnetic resonance imaging data without electromagnetic interference. The first electromagnetic interference signal and the magnetic resonance imaging signals measured by the receiving coil 1 may be superposed as the interfered imaging signals with electromagnetic interference, the interfered imaging signals together with the second electromagnetic interference signals measured by the sensing coils may be input into the model via different channels, and the magnetic resonance imaging signals may be used as the output of the model.

In an embodiment, the model training module 4 may further include a second model training unit 42. The second model training unit 42 is configured for truncating first segments from the interfered imaging signals, truncating corresponding second segments from the corresponding second electromagnetic interference signals, truncating corresponding third segments from the corresponding magnetic resonance imaging signals, taking the first segments and the corresponding second segments as input, taking the corresponding third segments as output, and training and obtaining the electromagnetic interference eliminating model.

Specifically, in the present embodiment, the input of the electromagnetic interference eliminating model may be the first segments from the interfered imaging signals and the second segments from the corresponding second electromagnetic interference signals in the above embodiments, the output of the electromagnetic interference eliminating model may be the corresponding third segments from the corresponding magnetic resonance imaging signals. Since an interference strength, a location, and the like of the interference sources are uncertain, there may be a relatively large fluctuation in a short time. The segments of magnetic resonance signals with relatively stable interference signals may be segmented as input or output of the electromagnetic interference eliminating model, thereby improving accuracy of the electromagnetic interference eliminating model. In addition, more training samples may be obtained in a segmentation manner, thereby improving training stability.

Alternatively, input and output data in an acquiring period may be concatenated together, so as to improve stability of the electromagnetic interference eliminating model. For example, in a magnetic resonance imaging process, it is assumed that one echo may have 100 pieces of sampled data, and a data length input into the electromagnetic interference eliminating model may be 100. In addition, sampling data of N adjacent echoes may be concatenated together. In this way, a data length input into the electromagnetic interference eliminating model may be 100×N. In some actual imaging cases, the reconstruction imaging may need to be performed on a relatively long echo when performing a magnetic resonance examination on the patient. Therefore, the concatenated data may be input into the electromagnetic interference eliminating model to train the electromagnetic interference eliminating model, thereby enhancing stability of the electromagnetic interference eliminating model in some cases of the magnetic resonance examination.

The present disclosure further provides an imaging method of eliminating electromagnetic interference of magnetic resonance, applied to the above imaging device of eliminating electromagnetic interference of magnetic resonance. The imaging method includes:

Step 1, the imaging device acquiring a plurality of magnetic resonance imaging signals, acquiring a first electromagnetic interference signal, by the receiving coil, obtained by measurement in an electromagnetic interference affected environment, and acquiring second electromagnetic interference signals, by the plurality of sensing coils, obtained by measurement in the electromagnetic interference affected environment;

Step 2, the imaging device superposing the plurality of magnetic resonance imaging signals with the first electromagnetic interference signal to obtain interfered imaging signals, respectively, taking the interfered imaging signals and corresponding second electromagnetic interference signals as input, taking corresponding magnetic resonance imaging signals as output, and training and obtaining an electromagnetic interference eliminating model;

Step 3, the imaging device inputting a real-time magnetic resonance imaging signal that is acquired by the receiving coil and a real-time electromagnetic interference signal that is acquired by the plurality of sensing coils into the electromagnetic interference eliminating model in a magnetic resonance imaging process, to obtain a predicted magnetic resonance imaging signal that eliminates electromagnetic interference; and Step 4, the imaging device performing image reconstruction on the predicted magnetic resonance imaging signal to obtain a magnetic resonance image.

In an embodiment, at Step 1, acquiring the first electromagnetic interference signal may further include:

the receiving coil obtaining the first electromagnetic interference signal by measurement in a period of a calibration window, or a period of waiting for a longitudinal magnetization vector to be restored to an original state; and

acquiring the second electromagnetic interference signals further includes:

the plurality of sensing coils obtaining the second electromagnetic interference signals by measurement in the period of the calibration window, or the period of waiting for the longitudinal magnetization vector to be restored to the original state.

Specific limitations on the method may be referred to the above limitations on the device, which will not be repeated herein. The foregoing modules and units may be implemented by using a general computing apparatus. The modules and units may be concentrated on a single computing apparatus or distributed on a network formed by multiple computing apparatuses. Alternatively, the modules and units may be implemented by using program code executable by the computing apparatus. Therefore, the modules and units may be stored in the storage apparatus and executed by the computing apparatus. In some cases, the modules and units may be separately fabricated into integrated circuit modules, or multiple modules in the modules may be fabricated into a single integrated circuit module. This application is not limited to any specific hardware and software combination.

The various technical features of the above-described embodiments may be combined arbitrarily, and all possible combinations of the various technical features of the above-described embodiments have not been described for the sake of conciseness of description. However, as long as there is no contradiction in the combinations of these technical features, they should be considered to be within the scope of the present specification.

The above-described embodiments express only several embodiments of the present disclosure, which are described in a more specific and detailed manner, but are not to be construed as a limitation on the scope of the present disclosure. For one skilled in the art, several deformations and improvements can be made without departing from the conception of the present disclosure, all of which fall within the scope of protection of the present disclosure. Therefore, the scope of protection of the present disclosure shall be subject to the attached claims.

What is claimed is:

1. An imaging method of eliminating electromagnetic interference of magnetic resonance, applied to an imaging device of eliminating electromagnetic interference of magnetic resonance, comprising:

Step 1, the imaging device acquiring a plurality of magnetic resonance imaging signals, acquiring a first electromagnetic interference signal, by a receiving coil, obtained by measurement in an electromagnetic interference affected environment, and acquiring second electromagnetic interference signals, by a plurality of sensing coils, obtained by measurement in the electromagnetic interference affected environment;

Step 2, the imaging device superposing each of the plurality of magnetic resonance imaging signals with the first electromagnetic interference signal to obtain interfered imaging signals, respectively, taking the interfered imaging signals and corresponding second electromagnetic interference signals as input, and taking the plurality of magnetic resonance imaging signals as output, to train an electromagnetic interference eliminating model;

Step 3, the imaging device inputting a real-time magnetic resonance imaging signal that is acquired by the receiving coil and a real-time electromagnetic interference signal that is acquired by the plurality of sensing coils into the electromagnetic interference eliminating model in a magnetic resonance imaging process, to obtain a predicted magnetic resonance imaging signal that eliminates electromagnetic interference; and Step 4, the imaging device performing image reconstruction on the predicted magnetic resonance imaging signal to obtain a magnetic resonance image;

a model structure of the electromagnetic interference eliminating model comprises a first convolution layer, a first residual network layer, a first strided convolution layer, a second residual network layer, a second strided convolutional layer, a third residual network layer, a third strided convolution layer, a fourth residual network layer, a first deconvolution layer, a fifth residual network layer, a second deconvolution layer, a sixth residual network layer, a third deconvolution layer, a seventh residual network layer, and a second convolution layer, an input of the first convolution layer is used as an input of the electromagnetic interference eliminating model;

an input of the first residual network layer is connected to an output of the first convolution layer;

an input of the first strided convolution layer is connected to an output of the first residual network layer;

an input of the second residual network layer is connected to an output of the first strided convolution layer;

an input of the second strided convolution layer is connected to an output of the second residual network layer;

an input of the third residual network layer is connected to an output of the second strided convolution layer;

an input of the third strided convolution layer is connected to an output of the third residual network layer;

an input of the fourth residual network layer is connected to an output of the third strided convolution layer;

an input of the first deconvolution layer is connected to an output of the fourth residual network layer;

an input of the fifth residual network layer is connected to an output of the first deconvolution layer;

an input of the second deconvolution layer is connected to an output of the fifth residual network layer;

an input of the sixth residual network layer is connected to an output of the second deconvolution layer;

an input of the third deconvolution layer is connected to an output of the sixth residual network layer;

an input of the seventh residual network layer is connected to an output of the third deconvolution layer;

an input of the second convolution layer is connected to an output of the seventh residual network, and an output of the second convolution layer is used as an output of the electromagnetic interference eliminating model; and the first strided convolution layer is in skip connection with the third strided convolution layer, the second strided convolution layer is in skip connection with the second strided convolution layer, and the third strided convolution layer is in skip connection with the first strided convolution layer.

2. The imaging method of claim 1, wherein at Step 1, acquiring the first electromagnetic interference signal further comprises:

the receiving coil obtaining the first electromagnetic interference signal by measurement in a period of a calibration window, or a period of waiting for a longitudinal magnetization vector to be restored to an original state; and acquiring the second electromagnetic interference signals further comprises:

the plurality of sensing coils obtaining the second electromagnetic interference signals by measurement in the period of the calibration window, or the period of waiting for the longitudinal magnetization vector to be restored to the original state.

3. The imaging method of claim 1, wherein acquiring the plurality of magnetic resonance imaging signals further comprises:

acquiring, in a non-electromagnetic interference affected environment, magnetic resonance signals acquired by the receiving coil as the magnetic resonance imaging signals;

acquiring, in an electromagnetic interference affected environment, magnetic resonance signals acquired by the receiving coil as the magnetic resonance imaging signals;

emulating and generating the magnetic resonance imaging signals; or randomly generating the magnetic resonance imaging signals.

4. The imaging method of claim 1, wherein the imaging device further comprises a built-in radio frequency system, acquiring the first electromagnetic interference signal further comprises:

acquiring, in an environment in which electromagnetic interference is caused and the radio frequency system disables transmitting radio frequency, an electromagnetic signal measured by the receiving coil as the first electromagnetic interference signal.

5. The imaging method of claim 1, wherein acquiring the first electromagnetic interference signal further comprises:

converting the first electromagnetic interference signal to obtain corresponding frequency domain spatial data, and taking high frequency data of the frequency domain spatial data as a new first electromagnetic interference signal, wherein in the high frequency data, an amplitude of the magnetic resonance imaging signals is lower than that of the first electromagnetic interference.

6. The imaging method of claim 1, wherein taking the interfered imaging signals and corresponding second electromagnetic interference signals as input, taking the plurality of magnetic resonance imaging signals as output, to training the electromagnetic interference eliminating model further comprises:

converting the interfered imaging signals into corresponding first frequency domain data, converting the corresponding second electromagnetic interference signals into corresponding second frequency domain data, converting the plurality of magnetic resonance imaging signals into corresponding third frequency domain data, taking the first frequency domain data and the second frequency domain data as input, taking the corresponding third frequency domain data as output, to train the electromagnetic interference eliminating model.

7. The imaging method of claim 1, wherein taking the interfered imaging signals and corresponding second electromagnetic interference signals as input, taking the plurality of magnetic resonance imaging signals as output, to train the electromagnetic interference eliminating model further comprises:

truncating first segments from the interfered imaging signals, truncating corresponding second segments from the corresponding second electromagnetic interference signals, truncating corresponding third segments from the plurality of magnetic resonance imaging signals, taking the first segments and the corresponding second segments as input, taking the corresponding third segments as output, to train the electromagnetic interference eliminating model.

* * * * *